United States Patent
Tuominen et al.

(10) Patent No.: US 8,240,033 B2
(45) Date of Patent: Aug. 14, 2012

(54) METHOD FOR MANUFACTURING A CIRCUIT BOARD

(75) Inventors: Risto Tuominen, Helsinki (FI); Antti Iihola, Helsinki (FI); Petteri Palm, Helsinkin (FI)

(73) Assignee: Imbera Electronics OY, Espoo (FI)

( * ) Notice: Subject to any disclaimer, the term of this patent is extended or adjusted under 35 U.S.C. 154(b) by 982 days.

(21) Appl. No.: 11/917,711

(22) PCT Filed: Jun. 15, 2006

(86) PCT No.: PCT/FI2006/000208
§ 371 (c)(1),
(2), (4) Date: Apr. 28, 2008

(87) PCT Pub. No.: WO2006/134217
PCT Pub. Date: Dec. 21, 2006

(65) Prior Publication Data
US 2008/0196930 A1     Aug. 21, 2008

(30) Foreign Application Priority Data
Jun. 16, 2005    (FI) .................................... 20050645

(51) Int. Cl.
*H05K 3/30* (2006.01)
(52) U.S. Cl. .............. 29/841; 29/832; 29/848; 174/260; 438/126
(58) Field of Classification Search ................. 174/255, 174/260, 262; 361/760; 257/723, 774; 438/126; 29/830–832, 840, 841, 846–849, 852
See application file for complete search history.

(56) References Cited

U.S. PATENT DOCUMENTS

| | | | |
|---|---|---|---|
| 4,246,595 A | 1/1981 | Noyori et al. | |
| 4,731,645 A | 3/1988 | Parmentier et al. | |
| 4,993,148 A | 2/1991 | Adachi et al. | |
| 5,042,145 A | 8/1991 | Boucquet | |
| 5,048,179 A | 9/1991 | Shindo et al. | |
| 5,081,562 A | 1/1992 | Adachi et al. | |
| 5,216,806 A | 6/1993 | Lam | |
| 5,227,338 A * | 7/1993 | Kryzaniwsky | 29/841 |
| 5,248,852 A | 9/1993 | Kumagai | |
| 5,306,670 A | 4/1994 | Mowatt et al. | |
| 5,353,195 A | 10/1994 | Fillion et al. | |

(Continued)

FOREIGN PATENT DOCUMENTS

EP     0774888     5/1997

(Continued)

OTHER PUBLICATIONS

International Preliminary Report on Patentability for PCT/FI2006/000208, Nov. 3, 2006, 11 pgs.

*Primary Examiner* — Donghai D. Nguyen
(74) *Attorney, Agent, or Firm* — Faegre Baker Daniels LLP

(57) ABSTRACT

This publication discloses a method for manufacturing a circuit-board structure. According to the method, a conductor pattern (13) is made, and contact openings are made in it for a component's (16) electrical contacts. After this, the component (16) is attached relative to the conductor pattern (13), in such a way that the contact areas or contact bumps of the component lie next to the contact openings. After this, an electrically conductive material is introduced to the contact openings, in order to form electrical contacts between the conductor pattern (13) and the component (16).

21 Claims, 16 Drawing Sheets

U.S. PATENT DOCUMENTS

| | | | |
|---|---|---|---|
| 5,355,102 A | 10/1994 | Komrumpf et al. |
| 5,407,864 A | 4/1995 | Kim |
| 5,497,033 A | 3/1996 | Fillion et al. |
| 5,510,580 A | 4/1996 | Shirai et al. |
| 5,552,633 A | 9/1996 | Sharma |
| 5,633,204 A | 5/1997 | Tago et al. |
| 5,637,919 A | 6/1997 | Grabbe |
| 5,654,220 A | 8/1997 | Leedy |
| 5,838,545 A | 11/1998 | Clocher et al. |
| 5,840,593 A | 11/1998 | Leedy |
| 5,870,289 A | 2/1999 | Tokuda et al. |
| 5,882,957 A * | 3/1999 | Lin ............................... 438/126 |
| 5,936,847 A | 8/1999 | Kazle |
| 5,985,693 A | 11/1999 | Leedy |
| 6,037,665 A | 3/2000 | Miyazaki |
| 6,038,133 A | 3/2000 | Naktani et al. |
| 6,084,781 A | 7/2000 | Klein |
| 6,154,366 A | 11/2000 | Ma et al. |
| 6,232,666 B1 | 5/2001 | Corisis et al. |
| 6,242,282 B1 | 6/2001 | Fillion et al. |
| 6,271,469 B1 | 8/2001 | Ma et al. |
| 6,284,564 B1 | 9/2001 | Balch et al. |
| 6,292,366 B1 | 9/2001 | Platt |
| 6,396,148 B1 | 5/2002 | Eichelberger et al. |
| 6,402,970 B1 | 6/2002 | Lin |
| 6,475,877 B1 | 11/2002 | Saia et al. |
| 6,489,685 B2 | 12/2002 | Asahi et al. |
| 6,537,848 B2 | 3/2003 | Camenforte et al. |
| 6,538,210 B2 | 3/2003 | Sugaya et al. |
| 6,551,861 B1 | 4/2003 | Lin |
| 6,562,660 B1 | 5/2003 | Sakamoto et al. |
| 6,576,493 B1 | 6/2003 | Lin |
| 6,607,943 B1 | 8/2003 | Kinsman |
| 6,701,614 B2 | 3/2004 | Ding et al. |
| 6,710,458 B2 | 3/2004 | Seko |
| 6,713,859 B1 | 3/2004 | Ma |
| 6,783,077 B1 | 8/2004 | Fannasch |
| 6,790,712 B2 | 9/2004 | Bai |
| 6,806,428 B1 | 10/2004 | Kimura et al. |
| 6,876,072 B1 | 4/2005 | Wang et al. |
| 6,979,596 B2 | 12/2005 | Corisis et al. |
| 6,991,966 B2 | 1/2006 | Tuominen |
| 7,183,658 B2 | 2/2007 | Towle et al. |
| 7,294,529 B2 | 11/2007 | Tuominen |
| 7,358,445 B1 | 4/2008 | Mohri et al. |
| 7,663,215 B2 | 2/2010 | Tuominen et al. |
| 7,673,387 B2 | 3/2010 | Tuominen et al. |
| 7,696,005 B2 | 4/2010 | Iihola et al. |
| 2002/0017711 A1 | 2/2002 | Kwon et al. |
| 2002/0053465 A1 | 5/2002 | Kawakita et al. |
| 2002/0117743 A1 | 8/2002 | Nakatani et al. |
| 2002/0133943 A1 | 9/2002 | Sakamoto et al. |
| 2002/0185303 A1 | 12/2002 | Takeuchi et al. |
| 2003/0067074 A1 | 4/2003 | Kinsman |
| 2003/0068877 A1 | 4/2003 | Kinsman |
| 2003/0100142 A1 | 5/2003 | Shin et al. |
| 2003/0137045 A1 | 7/2003 | Sugaya et al. |
| 2003/0159852 A1 | 8/2003 | Nakamura |
| 2003/0209796 A1 | 11/2003 | Kondo et al. |
| 2004/0097086 A1 | 5/2004 | Igarashi et al. |
| 2004/0266067 A1 | 12/2004 | Bai |
| 2005/0000729 A1 | 1/2005 | Iljima et al. |
| 2005/0001331 A1 | 1/2005 | Kojima et al. |
| 2005/0285244 A1 | 12/2005 | Chen |
| 2006/0105500 A1 | 5/2006 | Chang |
| 2006/0124345 A1 | 6/2006 | Asami et al. |
| 2006/0163740 A1 | 7/2006 | Ohno et al. |
| 2007/0166886 A1 | 7/2007 | Iihola et al. |
| 2007/0267136 A1 | 11/2007 | Tuominen et al. |
| 2008/0202801 A1 | 8/2008 | Tuominen et al. |
| 2010/0202115 A1 | 8/2010 | Tuominen et al. |

FOREIGN PATENT DOCUMENTS

| | | |
|---|---|---|
| EP | 1111662 | 6/2001 |
| EP | 1156525 | 11/2001 |
| EP | 1542519 | 6/2005 |
| GB | 2342995 | 5/2000 |
| JP | 04283987 | 10/1992 |
| JP | 9139567 A1 | 5/1997 |
| JP | 2757748 B2 | 5/1998 |
| JP | 11103165 A1 | 4/1999 |
| JP | 2000311229 | 11/2000 |
| JP | 2000349437 A1 | 12/2000 |
| JP | 2001053447 | 2/2001 |
| JP | 2001274034 | 10/2001 |
| JP | 2001345560 | 12/2001 |
| JP | 2002016327 | 1/2002 |
| JP | 2002158307 | 5/2002 |
| JP | 2002271033 | 9/2002 |
| JP | 200337205 | 2/2003 |
| JP | 2003188314 | 7/2003 |
| JP | 2004146634 A1 | 5/2004 |
| WO | WO03065778 | 8/2003 |
| WO | WO03065779 | 8/2003 |
| WO | WO2004077902 | 9/2004 |
| WO | WO2004077903 | 9/2004 |
| WO | WO2004089048 | 10/2004 |
| WO | WO2005020651 | 3/2005 |
| WO | WO2005027602 | 3/2005 |

* cited by examiner

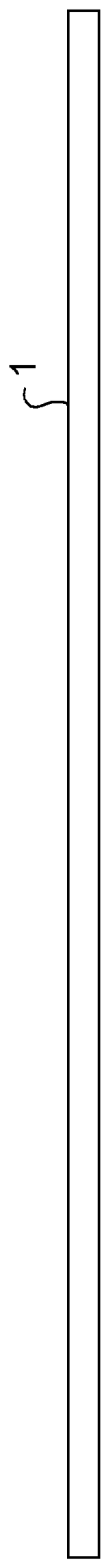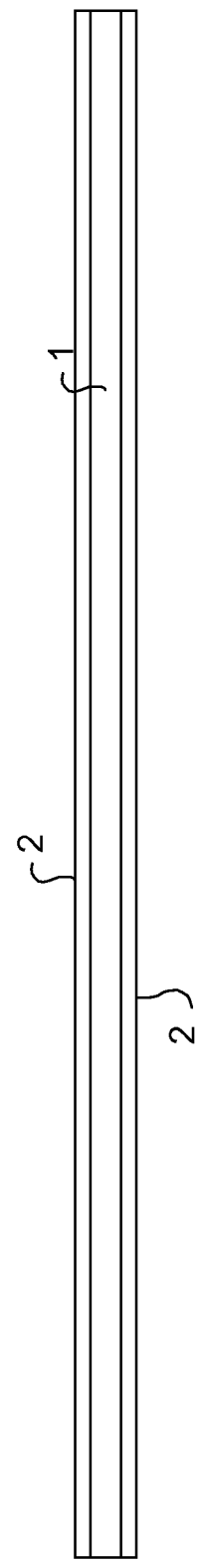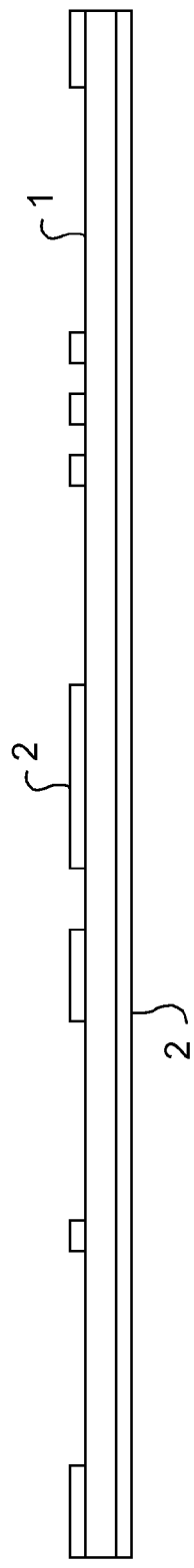

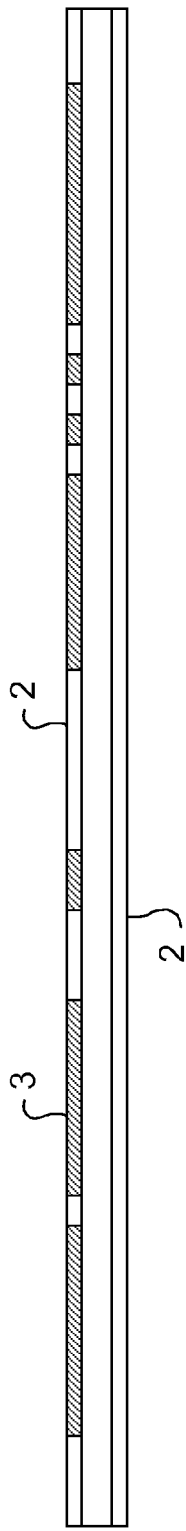
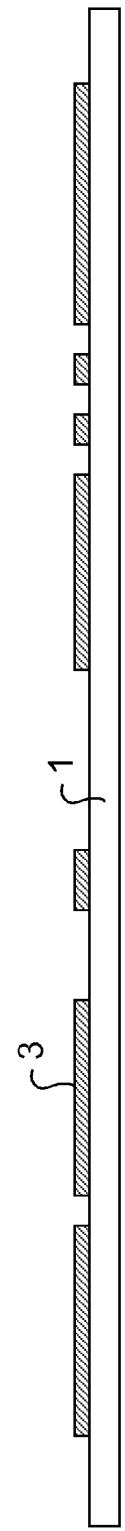
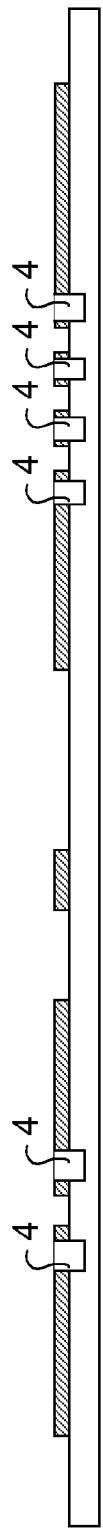
Fig. 4
Fig. 5
Fig. 6

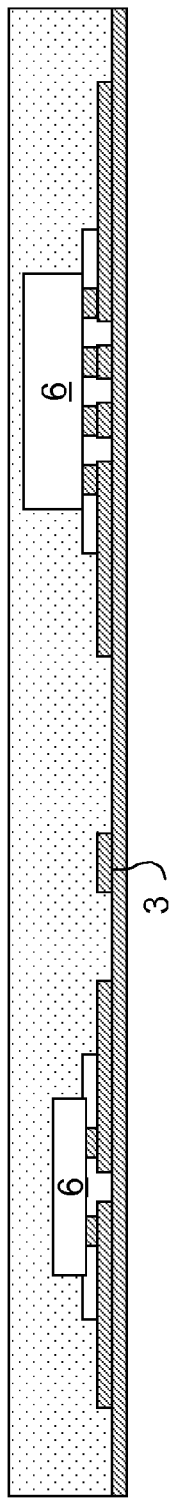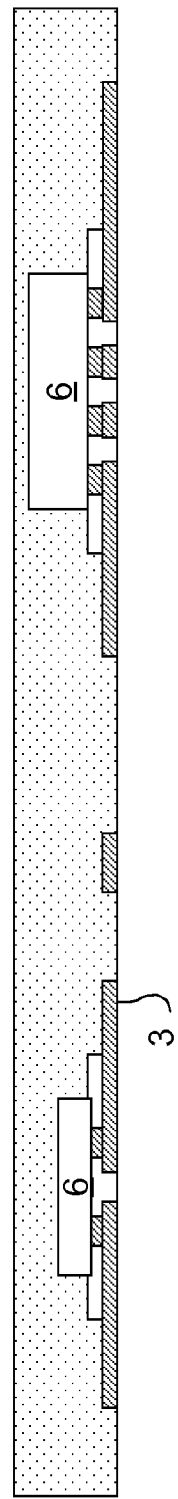
Fig. 13
Fig. 14

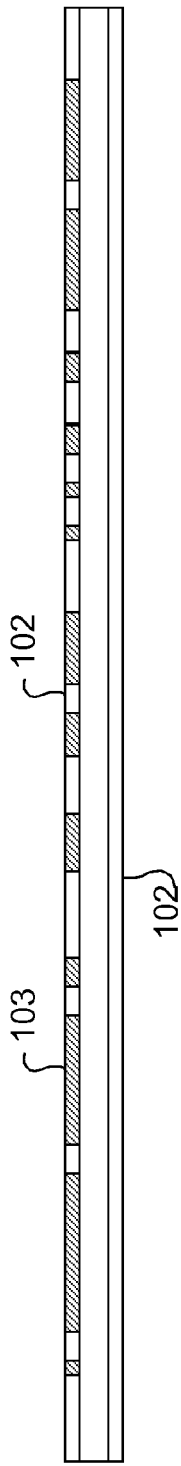
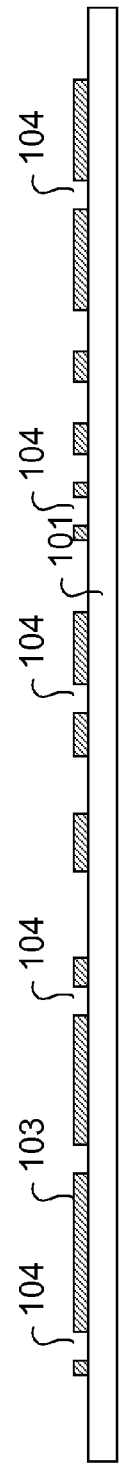
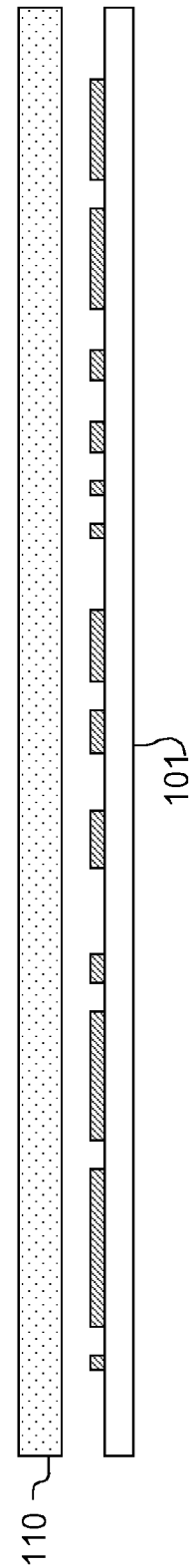
Fig. 36
Fig. 37
Fig. 38

METHOD FOR MANUFACTURING A CIRCUIT BOARD

CROSS REFERENCE TO RELATED APPLICATION

This application is a U.S. nationalized patent application of PCT/FI2006/000208, filed Jun. 15, 2006, which claims priority to Finnish Patent Application No. 20050645 filed Jun. 16, 2005, the entire disclosures of each are hereby expressly incorporated by reference herein.

The present invention relates to a method for manufacturing a circuit-board structure.

The manufactured circuit-board structure can form part of, for example, a circuit board, a multi-layer circuit board, a component package, or an electronic module.

The circuit-board structure can be of a type that comprises at least one layer of conductor patterns and at least one component, which is connected electrically to the conductor patterns.

The circuit-board structure can also be of a type that comprises at least conductor patterns in at least two layers and at least one via, which connects a conductor in one layer electrically to a conductor in the second layer.

The invention thus relates to manufacturing methods for multi-layer circuit boards. The invention also relates to such circuit-board manufacturing methods, in which at least one component connected to a conductor pattern is surrounded with an insulating-material layer. Solutions of this kind can also be referred to alternatively as circuit-board or module structures, which contain buried, embedded, or built-in components. The insulating-material layer surrounding the component is typically part of the base structure of the circuit board or module, which forms a support for the innermost conductor layers of the circuit board or module.

Application publication US 2005/0001331 discloses a circuit-board structure manufacturing method, in which first of all a circuit board is manufactured, which comprises an insulator layer and a conductor pattern on the surface of it. After this, a semiconductor component is attached to the conductor patterns on the surface of the circuit board by means of a suitable flip-chip attachment method. The attachment takes place by means of contact bumps on the surface of the semiconductor component. In the method of the US publication, after the attachment of the component a patterned and unpatterned insulating-material layer is laminated on top of the circuit board, and on top of them a further conductor-pattern layer.

Patent publications U.S. Pat. No. 6,038,133 and U.S. Pat. No. 6,489,685, as well as application publication US 2002/0117743 disclose a method, in which a conductor pattern is made on the surface of detachable film and a semiconductor component is attached to the conductor pattern using a flip-chip attachment method. After this, the component is surrounded with an insulating-material layer and the detachable film is removed.

The aforementioned publications U.S. Pat. No. 6,038,133 and US 2002/0117743 also disclose a method, in which a component is attached by the flip-chip method to a unified conductor foil, instead of to conductor patterns, from which conductor foil conductor patterns are formed at a later stage in the process. Corresponding methods are also disclosed, for example, in the publications, U.S. Pat. No. 5,042,145; WO 2004/077902; WO 2004/077903; and WO 2005/020651.

In addition to the aforementioned types of method, many other methods are also known, by means of which circuit-board structures containing components can be manufactured. For example, the components can first of all be placed inside an insulating-material layer and connected electrically to the conductor layer only after this, as disclosed in the application publication WO 2004/089048. In the method of application publication 204/089048, the component is glued to the surface of the conductor layer and, after the gluing of the component an insulating-material layer, which surrounds the component attached to the conductor layer, is formed on, or attached to the surface of the conductor layer. After the gluing of the component, vias are also made, through which electrical contacts can be made between the conductor layer and the component. After this, conductor patterns are formed from the conductor layer, to the surface of which the component was glued.

Attaching the component to a conductor pattern instead of to a unified conductor foil achieves the advantage that the conductor pattern can be first of all examined by an optical method prior to the attachment of components to the circuit-board blank. If the circuit boards or module being manufactured contain expensive components, cost advantages can be obtained using this conductor-pattern beforehand examination, because a faulty conductor pattern can be made good or removed from the process in an earlier stage. In the opposite procedure, components attached to the conductor foil and already embedded in the circuit-board blank will be lost if the patterning of the conductor foil fails.

The invention is intended to create a new method for the manufacture of a circuit-board structure.

According to the first aspect of the invention, a conductor pattern, as well as contact openings for making vias, is made in the circuit-board blank. After this, an insulating-material layer is made on the surface of the conductor layer. At the points indicated by the contact openings in the insulating-material layer, holes are made, which extend to a second conductor structure inside the insulating-material layer or on the opposite surface thereof. After this, a conducting material is brought to the holes in order to make electrical contacts between the conductor pattern and the second conductor structure. The second conductor structure can be, for example, a conductor pattern, or a contact area or contact bump of the component.

According to the second aspect of the invention, a conductor pattern, as well as contact openings for making vias, is made on the circuit-board blank. After this, an insulating-material layer is made on the surface of the conductor layer and a conductor layer or conductor-pattern layer on the surface of it. Holes, which extend through the insulator layer to the conductor layer or the conductor-pattern layer, are made in the insulating-material layer at the points indicated by the contact openings. After this, a conductor material is introduced to the holes, in order to form electrical contacts between the conductors on the opposite surfaces of the insulating-material layer.

According to the third aspect of the invention, a conductor pattern, in which contact openings are made at the locations of the contact areas of the components to be attached, is made in a circuit-board blank. The components are attached to the conductor pattern and electrical contacts are formed between the contact areas of the component and the conductor pattern, through the contact openings made in the conductor pattern.

In one embodiment, a conductor pattern is first made, and after this contact openings in the conductor pattern. After the manufacture of the contact openings, the component is aligned relative to the conductor pattern, in such a way that the contact areas or contact bumps of the component lie opposite to the contact openings.

In a second embodiment, both the conductor pattern and the contact openings made in it are made simultaneously. After the manufacture of the conductor pattern, the component is aligned relative to the conductor pattern, in such a way that the contact areas or contact bumps of the component lie opposite to the contact openings.

In a third embodiment, the conductor pattern is first made and after the manufacture of the conductor pattern the component is aligned relative to the conductor pattern and attached in place. After the attachment of the component, contact openings are made in the conductor pattern, in such a way that the contact areas or contact bumps of the component lie opposite to the contact openings.

According to a fourth aspect of the invention, a circuit-board structure is presented, which has been manufactured using a method according to the first, second, or third aspect of the invention.

According to a fifth aspect of the invention, a circuit-board structure is presented, which comprises a conductor in the conductor-pattern layer, as well as a via connected to the conductor, which via connects the conductor to a second conductor-pattern layer or to a component, in such a way that the diameter of the via is essentially as large as, or larger than the width of the conductor.

Each of the aforementioned aspects of the invention has, in addition, several different embodiments, which are described in greater detail in the following description of embodiments.

With the aid of some aspects and embodiments of the invention, a manufacturing method, for example, is created, which will permit the conductor pattern to be examined before components are attached to the circuit-board blank.

In addition, with the aid of some aspects and embodiments of the invention, a manufacturing method is created, which will permit electrical contacts to be made using the via method. In embodiments, in which a via is connected to a component, this will achieve the advantage, for example, that the surface of the contact areas (such as contact bumps) of components can be cleaned prior to the formation of an electrical contact. The via method also permits contacts to be made with the aid of a chemical or electrochemical growing method, in which case it will be possible to achieve excellent electrical properties for the contact between the conductor pattern and the component. In connection with the via method, it is also possible to use other surfacing methods.

For example, sputtering, vaporization, chemical or electrochemical surfacing, or some other suitable surfacing method or combination of surfacing methods can be used as the surfacing method.

According to some embodiments, the alignment of the vias can also be examined prior to attaching the components, or continuing the circuit-board-structure manufacturing process.

In embodiments, in which the contact openings are manufactured using a self-aligning method, the vias will automatically come to the correct location, at least relative to the conductor-pattern layer in which the contact openings are made.

In the following, the invention is examined with the aid of examples and with reference to the accompanying drawings.

FIGS. 1-14 show a series of cross-sections on the intermediate stages of circuit-board structures in a manufacturing process according to a first embodiment.

FIGS. 33-42 show a series of cross-sections of the intermediate stages of circuit-board structures in a manufacturing process according to a fourth embodiment.

Figure 7:

In the first example, manufacture is started according to FIG. 1 from a support layer 1, which is electrically conductive on a least one surface. When positioned according to the figure series, at least the upper surface of the support layer 1 is conductive. The conductivity property is required, for example, at a later stage in the method according to this example, to conduct the current required for electrolytic growing to the area in which the conductor material is being grown. In the method, in which the electrolytic growing of a conductor material is replaced by some other manufacturing method, the conductivity property of the support layer 1 will not necessarily be required, in which case the support layer 1 can also be non-conductive. In the example of the figures, the support layer 1 is, however, made throughout of a conductive material, typically of a metal and most usually of copper. The task of the support layer 1 is to provide mechanical support for the circuit-board blank, so that the support layer 1 must have the mechanical durability and stiffness required for processing. In the case of a copper sheet, these properties are achieved by selecting the thickness of the support layer 1 to be, for example, more than 50 micrometres.

After this, resist layers 2, typically photo-resist layers, are spread on both surfaces of the support layer 1. This stage is shown in FIG. 2. The photo-resist layer 2 is exposed through a patterned mask from one surface of the support layer 1, after which the blank is developed. After developing, the exposed photo-resist layer 2 is patterned as desired to form a conductor-pattern mask, which is shown in FIG. 3.

Manufacture is continued by growing electrolytically a conductor material, typically copper, in the areas from which the photo-resist has been removed. The desired conductor pattern 3, which is shown in FIG. 4, is thus formed on the surface of the support layer 1. The thickness of the conductor pattern can be, for example, 20 micrometres, while the thickness of the line of the conductor patterns made can also be less than 20 micrometres. Thus, the method can also be used to manufacture small and precise conductor patterns. The conductor patterns 3 can also be made thick relative to the width of the conductor patterns, in which case good conductivity properties will be achieved with the use of a small surface area of the circuit-board structure. The thickness of the conductor pattern 3 can thus be, for example, equal to the width, or the thickness (height) can be greater, for example, 1.2-3-times greater than the width.

The conductor patterns 3 can also be made using some other method than that described. Suitable methods are, for example, the combined manufacture and patterning of the conductor layer, for example, by etching or laser ablation.

After making the conductor patterns 3, the resist layers 2 are removed. FIG. 5 shows the circuit-board blank after the removal of the resist layers 2. After this and before the attachment of the component 6 to the circuit-board blank, contact openings 4 are made in the conductor pattern 3, at the locations of the contact areas of the component 6. FIG. 6 shows the circuit-board blank after this intermediate stage. The contact openings 4 can be made, for example, by laser drilling. The mutual positioning of the contact openings 4 is selected according to the mutual positioning of the contact areas of the component and the location and position of each group of contact openings is selected in such a way that the component will be placed correctly relative to the entire circuit-board structure. Thus, one contact opening 4 is made for each contact area that participates in forming an electrical contact. The surface area of the contact openings 4 being made can be approximately as large as the surface area of the corresponding contact areas. The surface area of the contact opening 4 can, of course, also be selected to be smaller, or, in some embodiments, slightly larger than the surface area of the corresponding contact area.

The contact openings 4 can be drilled from the direction of the conductor pattern 3 or of the support layer 1. If the contact openings 4 are drilled from the direction of the conductor pattern 3, the openings drilled need not necessarily extend entirely through the support layer 1. In such an embodiment, the contact openings 4 are opened later, when the support layer 1 is removed. The contact openings 4 can also be opened in such a way that the material layer formed by the conductor pattern 3 and the support layer 1 is thinned by etching, from the direction of the support layer 1. The conductor layer 3 and the support layer 1 can also be formed from a single material layer. In that case, the part of the material layer corresponding to the support layer 1 is removed and the contact openings 4 are opened. The contact opening 4 is thus intended to extend through the entire conductor pattern 3. Drilling can be implemented, for example, mechanically, or with the aid of a laser. It is also possible to make the contact openings 4, for example, with the aid of plasma etching.

Contact openings 4 can also be designed in the resist mask, in which case the openings 4 will be created in the conductor pattern 3 in connection with it manufacture and will open when the support layer 1 is removed.

It is also possible to proceed in such a way that the contact openings 4 are made only after the gluing of the component 6. In that case, the component can be aligned in place with the aid of the conductor pattern 3 and the contact openings 4 also made aligned relative to the conductor pattern. In this way, the contact areas or contact bumps of the component too will be aligned relative to the contact openings 4. In such an embodiment, the contact openings 4 are made on the surface of the conductor pattern 3 opposite to the surface of the conductor pattern 3, from the direction of which the component 6 will be glued. With reference to FIG. 6, it can be noted that the contact openings 4 can be made either from the direction of the conductor pattern 3, or from the direction of the support layer 1. The contact openings 4 can extend through both layers 1 and 3, or alternatively for a recess, which extends through the conductor pattern 3. It is also possible to made the contact openings 4 in stages, in such a way that first of all recess is made from the direction of the support layer 1 that does not yet extend entirely through the conductor pattern 3, and at a later stage of the process a contact opening 4 is opened to penetrate through the conductor pattern 3. The method of the example can also be modified in such a way that the component 6 is glued to the surface of the support layer 1 and an electrical contact between the conductor pattern 3 and the component is made through the support layer 1. In this case, the support layer 1 is insulating. The method of the example can also be modified in such a way that the component 6 is glued to the surface of the support layer 1 and the conductor material of the support layer 1 is removed from the area between the conductor patterns 3.

Figure 8:
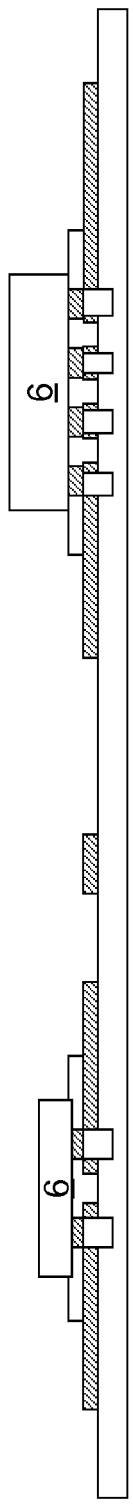

The components 6 are attached to the surface of the conductor pattern 3 with the aid of adhesive. For gluing, an adhesive layer 5 is spread on the attachment surface of the conductor pattern 3 or the attachment surface of the component 6, or on both attachment surfaces. The adhesive 5 can also be spread in stages and in layers. After this, the components 6 can be aligned in the positions planned for the components 6, with the aid of alignment marks. FIG. 8 shows the circuit-board blank after the gluing of the components 6.

The term attachment surface of the component 6 refers to that surface of the component 6 that will face the conductor pattern 3. The attachment surface of the component 6 comprises contact areas, by means of which an electrical contact can be formed to the component. The contact areas can be, for example, flat areas on the surface of the component 6, or more usually contact protrusions, such as contact bumps, protruding from the surface of the component 6. There are generally at least two contact areas or protrusions in the component 6. In complex microcircuits, there can be very many contact areas.

In many embodiments, it is preferable to spread adhesive so liberally on the attachment surface or attachment surfaces that the adhesive fills the entire space remaining between the components 6 and the conductor pattern 3 and the support layer 1. There will then be no need for a separate filler agent. Filling the space remaining between the components 6 and the conductor pattern 3 and the support layer 1 reinforces the mechanical connection between the component 6 and the conductor pattern 3, thus achieving a mechanically more durable construction. A comprehensive and unbroken adhesive layer also support the conductor pattern 3 and protects the structure in later process stages. During gluing, the adhesive generally also finds its way in the contact openings 4.

The term adhesive refers to a material, by means of which components can be attached to the conductor pattern 3 and the support layer 1. One property of an adhesive is that it can be spread on the surface of the conductor pattern 3, the support layer 1, and/or the component in a liquid form, or in a form that otherwise conforms to the surface shapes, for example, in the form of a film. A second property of the adhesive is that, after spreading, the adhesive hardens, or can be hardened at least partly, in such a way that the adhesive is able to hold the component in place (relative to the conductor pattern 3) at least until the component is attached to the structure in some other way. A third property of the adhesive is its adhesive capacity, i.e. its ability to hold onto the surface being glued.

The term gluing refers to attaching a component and the conductor layer 3 or the support layer to each other with the aid of an adhesive. Thus, in gluing the adhesive is introduced between the component and the conductor layer 3 and/or the support layer 1 and the component is placed in a suitable position relative to the conductor pattern 3, in which the adhesive is in contact with the component and the conductor pattern 3 and/or the support layer 1, and at least partly fills the space between the component and the circuit-board blank. After this, the adhesive is allowed to harden (at least partly), or the adhesive is actively hardened (at least partly), so that the component is attached with the aid of the adhesive to the circuit-board blank. In some embodiments, the contact areas of the component may protrude through the adhesive layer during gluing, to come into contact with the conductor layer 3.

The adhesive used in the embodiments is, for example, a thermally cured epoxy. The adhesive is selected in such a way that the adhesive used will have sufficient adhesion to the circuit-board blank and the component. One preferable property of the adhesive is a suitable coefficient of thermal expansion, so that the thermal expansion of the adhesive will not differ too greatly from the thermal expansion of the surrounding material during the process. The adhesive selected should also preferably have short hardening time, preferably of a few seconds at most. Within this time the adhesive should harden at least partly so that the adhesive will be able to hold the component in place. The final hardening can take clearly more time and the final hardening can even be planned to take place in connection with later process stages. The electrical conductivity of the adhesive is preferably of the same order as the electrical conductivity of the insulating material.

The component 6 being attached can be, for example, an integrated circuit, such as a memory chip, a processor, or an ASIC. The component being attached can also be, for example, an MEMS, LED, or a passive component. The component being attached can be cased or uncased and can comprise contact bumps in its contact areas or be without bumps. On the surface of the contact areas of the component there can also be a conductor surfacing that is thinner than the contact bumps. Thus, the outer surface of the contact areas of the component can be at the level of the outer surface of the component, on the bottom of recesses in the surface of the component, or on the surface of protrusions protruding from the surface of the component.

Figure 9:
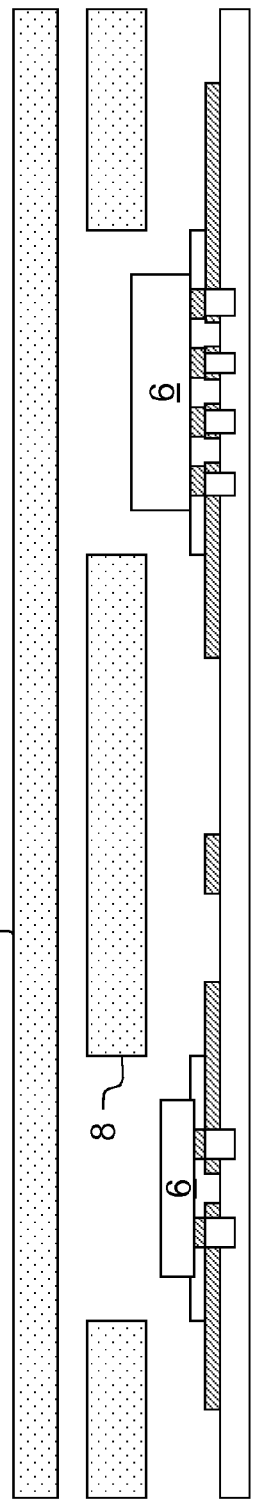

After the gluing of the components 6, an insulating layer 10 is made, which surrounds the components 6 and supports the conductor patterns 3. In the example of FIG. 9, the insulating layer 10 is formed by placing an insulating-material sheet 8, in which openings are made at the locations of the components 6, on top of the circuit-board blank. In addition, a continuous insulating-material sheet 9 is placed on top of the insulating-material sheet 8. Both sheets can be similar, or else sheets that differ from each other can also be used, at least one of which is pre-hardened or unhardened. Examples of materials suitable for the insulating layer 10 are PI (polyamide), FR1, FR5, aramid, polytetrafluorethylene, Teflon®, LCP (liquid crystal polymer), and a pre-hardened binder layer, i.e. prepreg. The insulating layer can thus also be spread in a fluid or liquid form.

Figure 10:
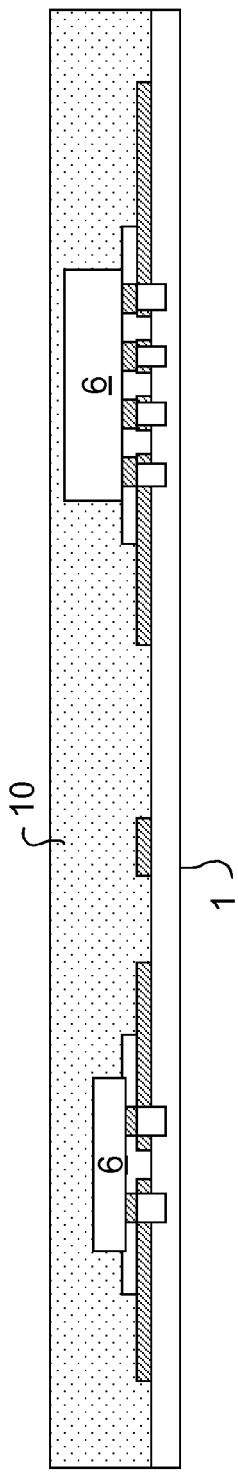
Figure 11:
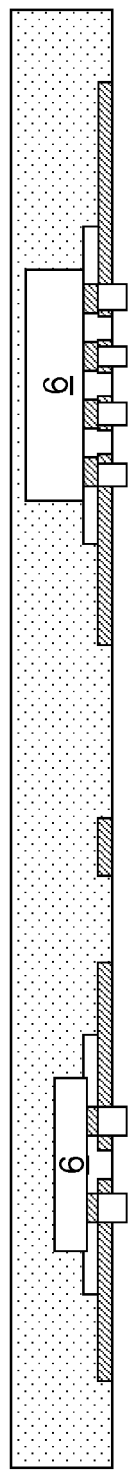

The insulating-material sheets 8 and 9 put on top of the circuit-board blank are pressed with the aid of heat and pressure to become a unified insulating layer 10. FIG. 10 shows a cross section of the circuit-board blank after this intermediate stage. In the insulating-material sheets, for example, on the upper surface of sheet 9, there can also be a ready conductor-pattern layer, in which case after pressing the circuit-board blank will comprise at least two conductor-pattern layers. After the manufacture of the insulating layer 10, the support layer 1 can be removed, when the structure shown by FIG. 11 will be obtained. The removal of the support layer 1 can be performed, for example, by etching or mechanically.

In an embodiment, in which the support layer 1 and the conductor patterns 3 are of the same material, for example, copper, and the support layer 1 is removed by etching, the boundary surface of the conductor patterns 3 on the support-layer 1 side can be manufactured more precisely, if a suitable intermediate layer, which will not dissolve in the etching agent used, or dissolves in it only extremely slowly, is used between the conductor patterns 3 and the support layer 1. In that case, the etching will stop at the intermediate layer and the surface of the conductor patterns 3 can be defined precisely. Such an intermediate layer can be made, for example, from some second metal. The intermediate layer can be made, for example, on the entire surface of the support layer 1 before the manufacture of the conductor patterns 3 and removed after the removal of the support layer 1, for example, chemically using some second etching agent. It is also possible to made the intermediate layer in connection with the growing of the conductor patterns 3, in such a way that first of all the material of the intermediate layer is grown on top of the support layer 1 and the actual conductor patterns 3 are grown on top of the material of the intermediate layer. In such an embodiment, the intermediate layer is thus manufactured only at the locations of the conductor patterns, thus saving material of the intermediate layer.

Figure 12:
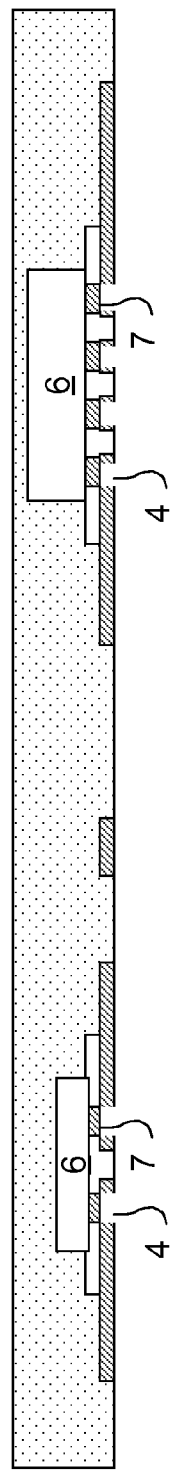

Next, vias are made in the circuit-board blank, with the aid of which electrical contacts can be formed between the contact areas 7 of the components 6 and the conductor patterns 3. For the manufacture of the vias, the contact openings 4 are cleaned of adhesive and other material that may have been pushed into them. In connection with the cleaning of the contact openings 4, it is possible to also clean the contact areas 7 of the components 6, in which case the conditions for the creation of a high-quality electrical contact will improve further. The cleaning can be performed, for example, using a plasma technique, chemically, or with the aid of a laser. FIG. 12 shows the contact openings 4 and contact areas 7 of the circuit-board blank after cleaning. If the contact openings 4 and the contact areas are already sufficiently clean, the cleaning can naturally be omitted.

After cleaning it is also possible to check the success of the alignment of the component 6, as the contact areas 7 of a correctly aligned component will appear through the contact openings 4, when viewed from the direction of the conductor pattern. Of course, the examination can be made in many other stages too.

After this, conductor material is introduced to the contact openings 4, in such a way that an electrical contact is created between the component 6 and the conductor pattern 3. The conductor material can be manufactured, for example, by filling the contact openings with an electrically conductive paste. The conductor material can also be manufactured using some of the many growing method known in the circuit-board industry. High-quality electrical contacts can be made, for example, by forming a metallurgical connection by growing the conductor material chemically or by an electrochemical method. One good alternative is to grow a thin layer by a chemical method and continue the growing using a cheaper electrochemical method. In addition to these methods, it is of course possible to use some other method, which is advantageous in terms of the final result.

In the example of the series of figures, the contact openings 4, the contact areas 7, the conductor patterns 3, and the bare surface remaining between the conductor patterns 3 of the insulating layer 10 are first of all surfaced with a thin conductor layer and then the thickness of the conductor layer is increased electrolytically until the contact openings 4 have been filled with conductor material. FIG. 13 shows the structure after the growing. After this, the circuit-board blank is etched to remove the excess conductor material. FIG. 14 shows the circuit-board structure after etching.

Figure 15:
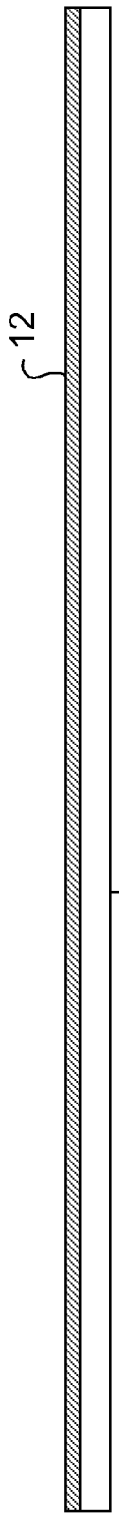
FIGS. 15-23 show a series of cross-sections of the intermediate stages of circuit-board structures in a manufacturing process according to a second embodiment.

FIGS. 15-23 show a second example of the manufacture of a circuit-board structure. FIG. 15 shows a circuit board, which comprises a support layer 11 and a conductor layer 12. In this embodiment, the support layer 11 is of an electrically insulating material. The support layer 11 can be, for example, an FR4 sheet, or contain some other material referred to above in connection with the insulating layer 10. Other suitable material can, of course, also be used in the support layer 11. The conductor layer 12 is usually of copper.

Figure 16:
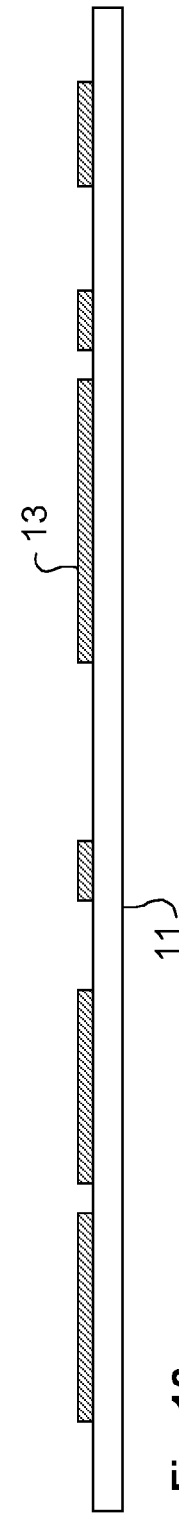
Figure 17:
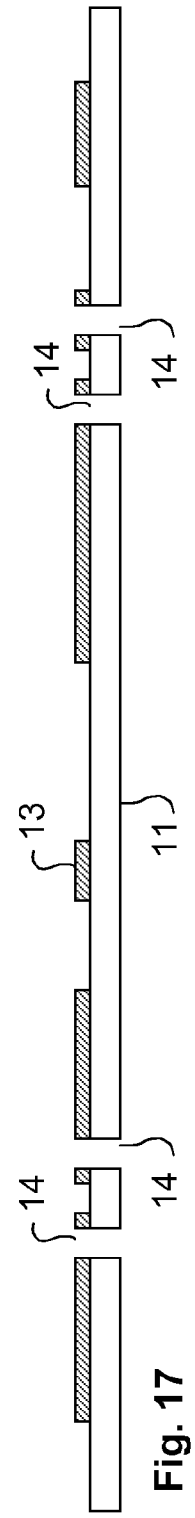

The conductor layer 12 is patterned to form conductor patterns 13, for example, by etching. This intermediate stage is shown in FIG. 16. Next contact openings 14 are made through the conductor patterns 13 and the support layer 11, at the locations of the contact areas of the component 16 to be attached. The contact openings 14 are made in the same way as the contact openings 4 described above. FIG. 17 shows the circuit-board blank after the manufacture of the contact openings 14.

Figure 18:
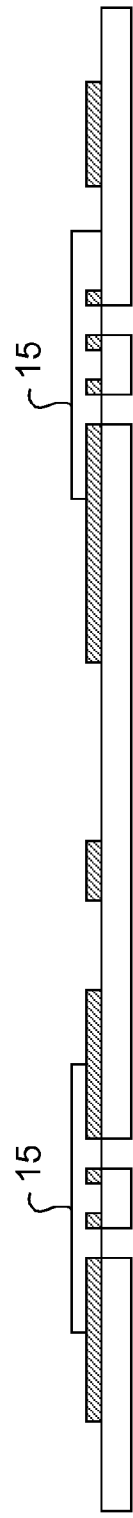
Figure 19:
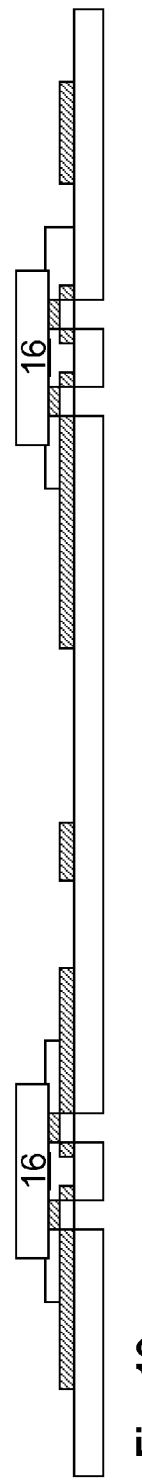
Figure 20:
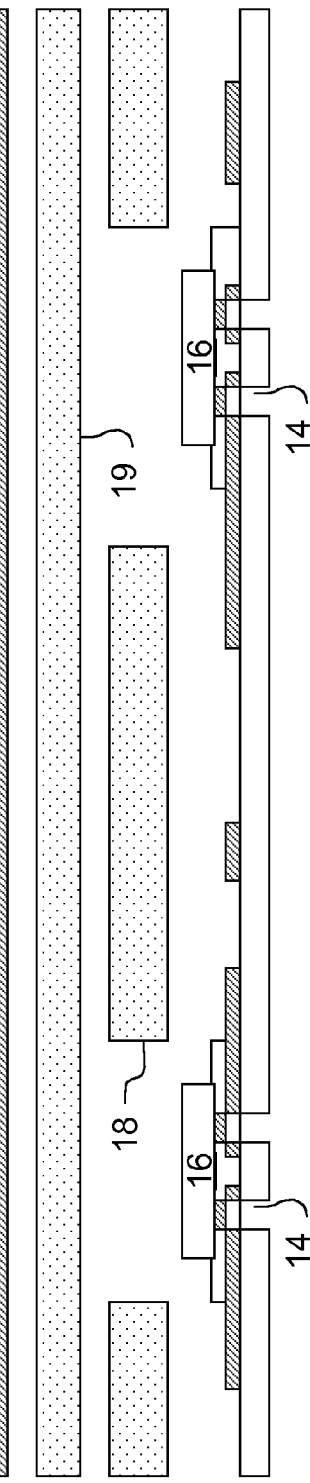
Figure 21:
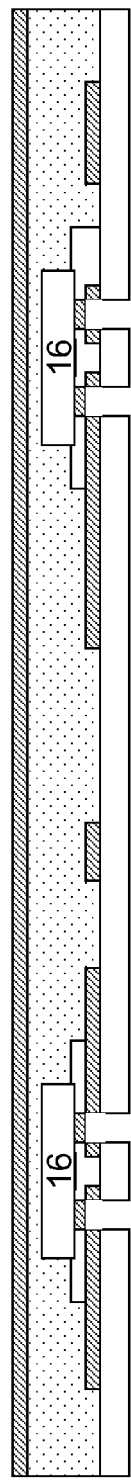

After the manufacture of the contact openings 14, adhesive 15 is spread on the circuit-board blank in the same way as described above in connection with the adhesive 5. FIG. 18 shows the circuit-board blank with the adhesive 15. After this, the components 16 are glued in place in the same way as the components 6, when the result is the structure shown in FIG. 19. After this, insulating-material sheets 18 and 19 are attached to the circuit-board blank in the same way as insulating-material sheets 8 and 9. In this example, a conductor layer 17 is also attached to the surface of the insulating-material sheet 19. FIG. 20 shows this intermediate stage. After this, the contact openings 14 and the contact areas of the components 16 are cleaned. FIG. 21 shows the circuit-board blank after this intermediate stage.

Figure 22:
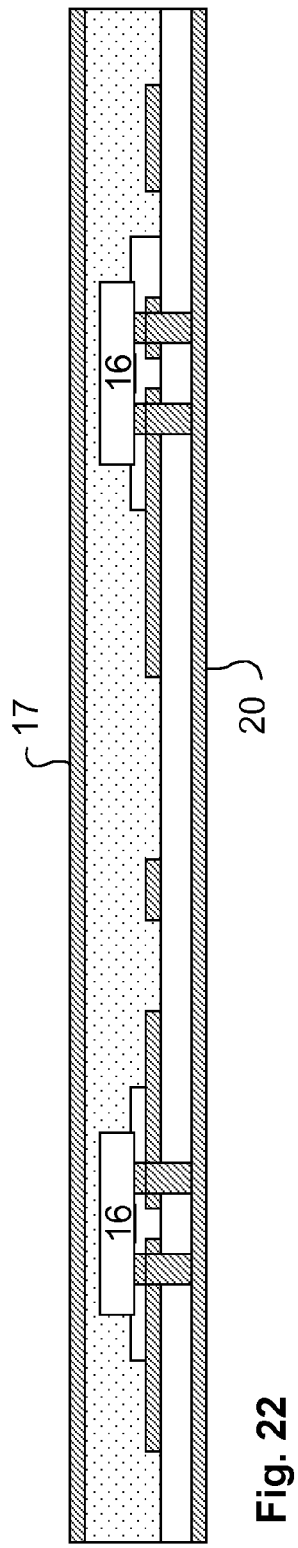

Next, electrical contacts are created to the components 16. This too can be made in the manner described above, for example, by filling the contact openings with a conductive paste. This will achieve the advantage of a short and simple manufacturing process. In this example, the conductive material is, however grown by making a thin surfacing and increasing the thickness of the conductive material by electrolytic growing, in such a way that the contact openings 14 are filled. At the same time, a third conductor layer 20 is grown on the circuit-board blank, and also comes into electrical contact with the components 16. FIG. 22 shows the circuit-board blank after this intermediate stage.

Figure 23:
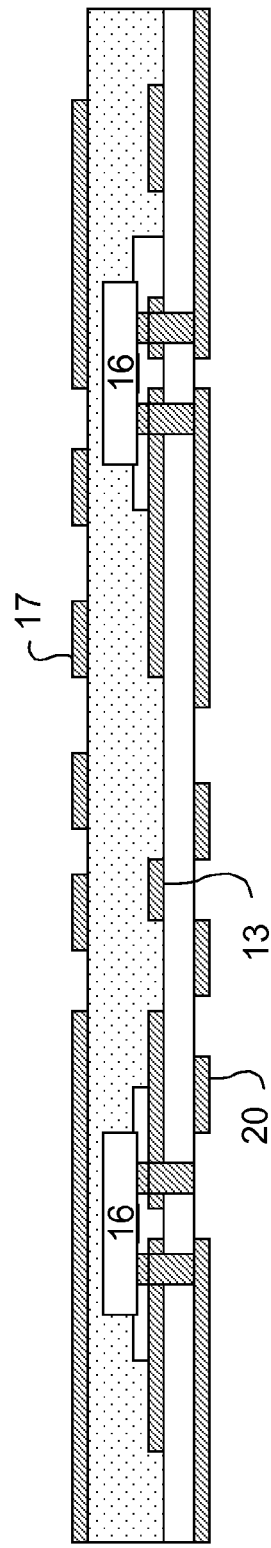
Figure 24:
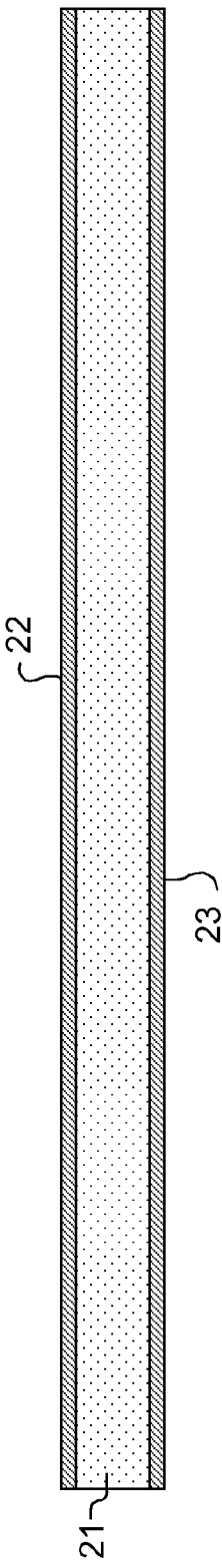
FIGS. 24-32 show a series of cross-sections of the intermediate stages of circuit-board structures in a manufacturing process according to a third embodiment.
Figure 25:
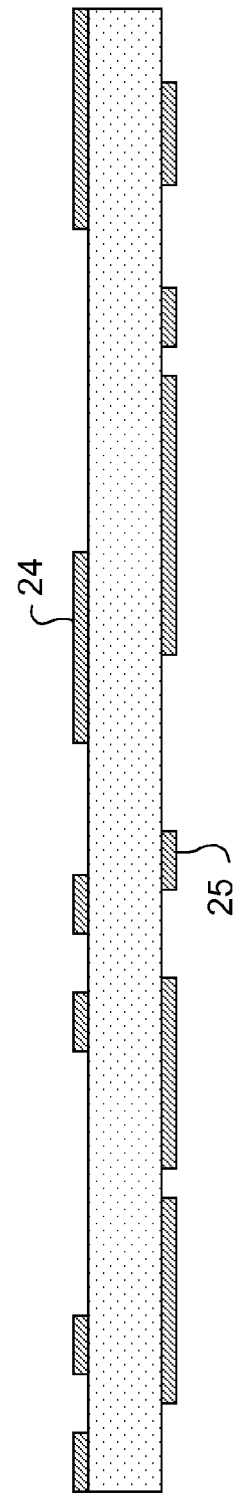

Next, the conductor layers 17 and 20 can be patterned, for example, by etching, thus making conductor patterns in the conductor layers 17 and 20. FIG. 23 shows the circuit board after the patterning. As can be seen from FIG. 23, with the aid of this manufacturing method the contact areas of the components 16 can be optionally connected to either the conductor-pattern layer 13 or the conductor-pattern layer 20. Contact can also be simultaneously created to both conductor-pattern layers 13 and 20. This property provides an opportunity for the flexible planning of the contacts of the components 16, and for the efficient use of space in the circuit-board structure.

FIGS. 24-32 show a third example of the manufacture of a circuit-board structure. In this example, manufacture commences from the base board shown in FIG. 24, which comprises an insulating-material layer 21, on the first surface of which is a conductor layer 22 and of the second surface a conductor layer 23. The conductor layers 22 and 23 are typically of copper. The material of the insulating-material layer 21 is, as in layer 10 of the example described above, for example, FR4, or some other suitable insulating material.

The conductor layers 22 and 23 are patterned to create conductor patterns 24 and 25. At the same time, it is also possible to manufacture an installation opening in the conductor pattern 24 or 25 for each component 26 to be placed in the structure and correspondingly design conductors in the conductor pattern 24 or 25 for connection to the contact areas of the component 26. The other areas of the conductor patterns 24 and 25 can be designed according to the other wiring requirements of the structure.

Figure 26:
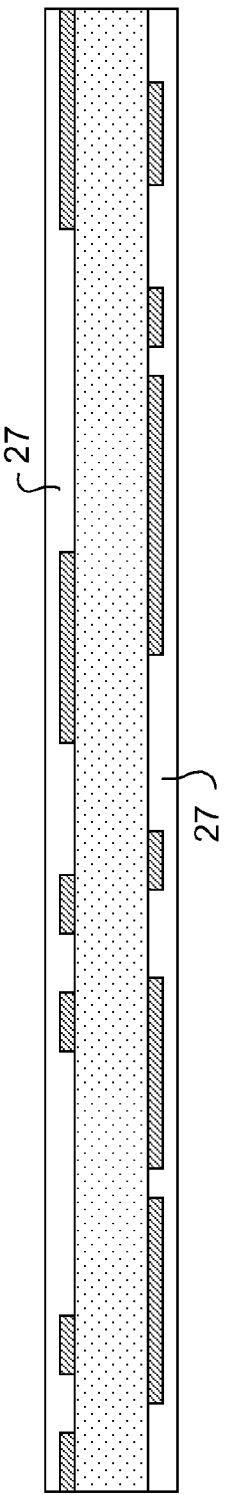
Figure 27:
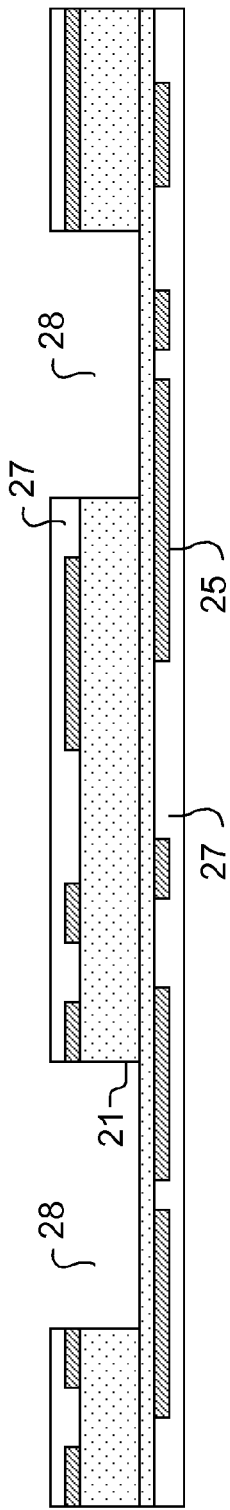

Next, both surfaces of the circuit-board blank are surfaces with an insulating-material layer 27. The insulating-material layers 27 can be manufactured, for example, by laminating pre-hardened insulating-material sheets onto the surfaces of the circuit-board blank. FIG. 26 shows the circuit-board blank after this stage.

Next, suitably sized and shaped recesses 28 are made in the circuit-board blank for the components 26 to be embedded in the structure. The recesses 28 can be made appropriately, for example, by using some known method used in circuit-board manufacture. The recesses 28 can be made, for example, using the $CO_2$-laser-ablation method, chemically by etching, or mechanically by milling. Thus, it is possible to also make recesses 28 from the directions of both surfaces, in embodiments in which it is wished to place some of the components 26 facing the conductor pattern 24 and some of them facing the conductor pattern 25. In the example, the recesses 28 are made in such a way that they penetrate the second insulating-material layer 27 and most of the insulating-material layer 21, but do not extend, however, quite as far as the conductor pattern 25. This can be implemented, for example, by using in the manufacture of the recess 28 a method that permits precise depth control. A second alternative is to manufacture the insulating-material layer 21 in layers, in such a way that the part to be removed and the part to be retained differ suitably in their properties. Thus, the recess 28 can be made to a suitable depth thanks to this difference, for example, in such a way that the manufacturing method of the recess 28 is selective in terms of this difference and the recess 28 stops itself at the boundary layer contained in the insulating-material layer 21.

One further possibility is to make the recess as far as the conductor pattern 25 and to continue manufacture on the bare surface of the conductor pattern 25. Yet another possibility is to make the recess as far as the conductor pattern 25 and manufacture a thin insulating layer, which covers the conductor pattern 25, on the bottom of the recess.

Figure 28:
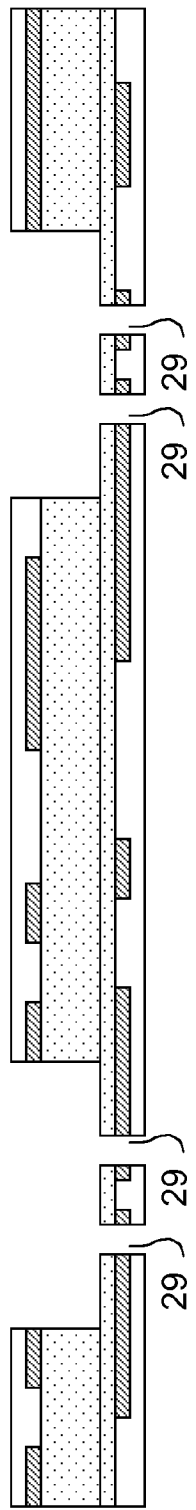

Next, contact openings 29 are made in the circuit-board blank at the locations of the contact areas of the components 26. The manufacture of the contact openings 29 is performed in the same way as that of the contact openings 4 described above. FIG. 28 shows the circuit-board blank after this intermediate stage.

Figure 29:
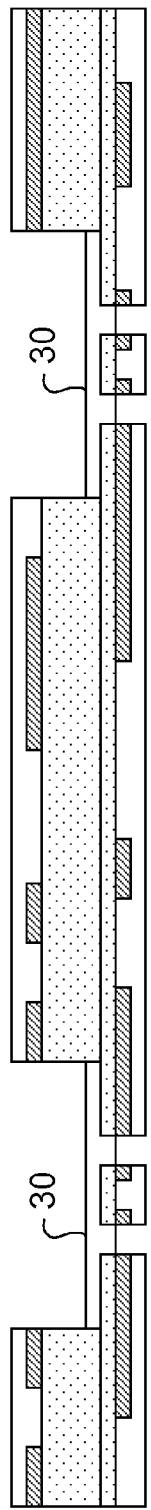
Figure 30:
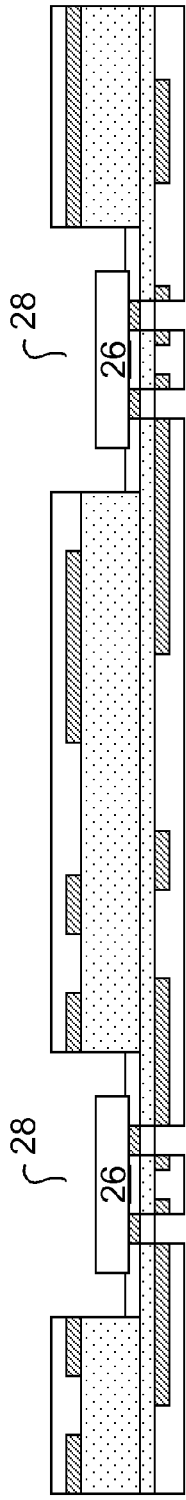
Figure 31:
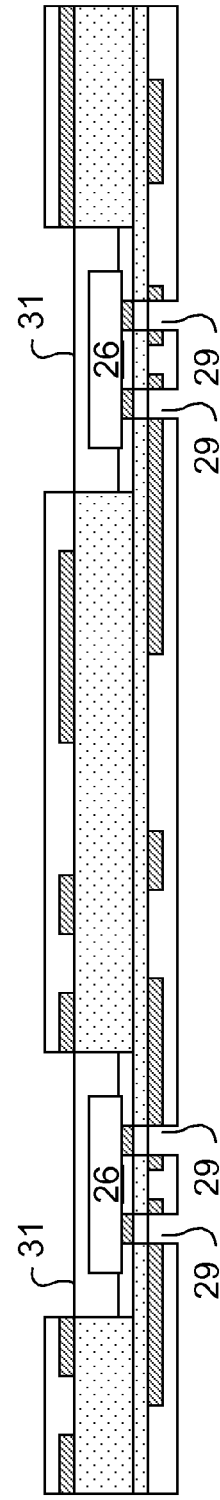
Figure 32:
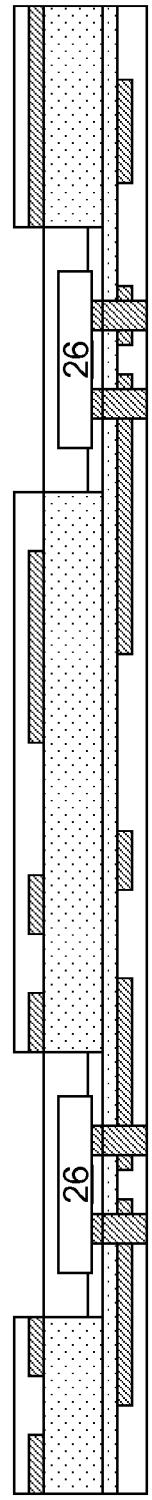

After the manufacture of the contact openings 29, adhesive 30 is spread on the circuit-board blank in the same way as described in connection with the adhesive 5. FIG. 29 presents the circuit-board blank with the adhesive 30. After this, the component 26 is glued in place in the same way as component 6, when the result is the structure shown in FIG. 30. After this, the recesses 28 can be filled with a filler material 31, if it is wished to reinforce the structure. FIG. 31 shows the circuit-board blank after the filling of the recesses 28. After this, the contact openings 29 and the contact areas of the components 26 are cleaned and electrical contacts are formed to the components 26. This too can be performed in the manner of the previous examples, by filling the contact openings with a conductive paste, or by growing conductive material electrolytically or chemically. FIG. 32 shows the circuit board after the creation of the contacts.

FIGS. 33-42 shows a fourth example of the manufacture of a circuit-board structure. In this example, the manufacture of electrical contacts between the conductor-pattern layers is described, so that in the method of the example semiconductor chips are not placed inside the circuit-board structure. Using such a method it is thus possible to manufacture, for example, a circuit board, to the surface of which separate components, such as semiconductor chips are attached. A corresponding method can, of course, also be used for the manufacture of circuit-board structures containing semiconductor chips, or semiconductor chips can be located in some second insulating layer, which is connected to the circuit-board structure described in the examples.

Figure 33:
Figure 34:
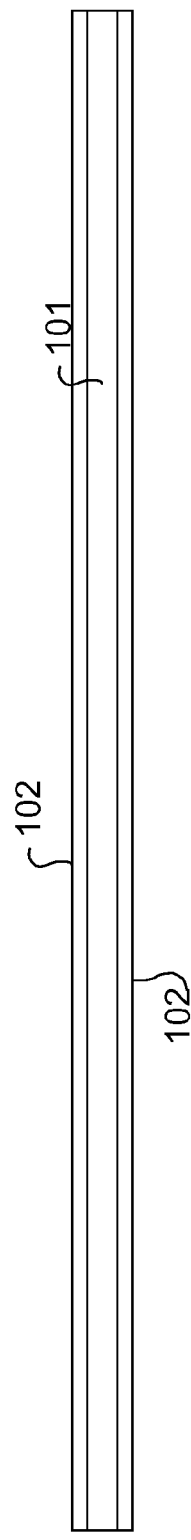
Figure 35:
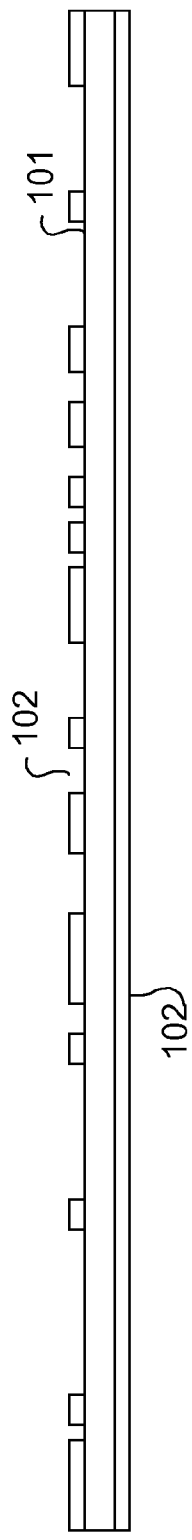

In this example, manufacture is started from a support layer 101 according to FIG. 33, on both surfaces of which are spread resist layer 102, typically photo-resist layers, according to FIG. 34. These stages of the method correspond to the stages of the method described in connection with FIGS. 1 and 2 of the first example. In the manner described in connection with FIG. 3, the photo-resist layer 102 is exposed and developed. The result is the structure shown in FIG. 35.

After this, conductive material 103, typically copper, is grown electrolytically in the openings opened in the photo-resist 102. This stage corresponds to the stage described in connection with FIG. 4. FIG. 36 shows the circuit-board blank after the growing of the conductive material. As has already been described in connection with FIG. 4, in this way it is possible to manufacture very precise conductor patterns, in which the conductors have the desired ratio between their height and width.

After the manufacture of the conductor patterns 103, the resist layers 102 are removed. FIG. 37 shows the circuit-board blank after the removal of the resist layers 102. In the embodiment depicted in this example, contact openings 104 are designed in the exposure mask of the conductor pattern 103, so that the finished conductor pattern 103 will already contain the finished contact openings 104. In other words, the contact openings 104 and the conductor pattern 103 are made simultaneously. Thus the contact openings 104 will always be aligned correctly relative to the conductor pattern 103. The position of the contact openings 104 relative to the conductor patterns is thus defined in a self-aligning manner. A corresponding self-aligning manner can also be used in the manufacturing methods depicted in the example described above. On the other hand, in the example of FIGS. 33-42 too the methods of manufacturing contact openings described above, in which the contact openings are made in a separate method stage, '5 could also be used. The contact-opening alignment and manufacturing method to be used can thus be selected freely, according to the application. The examples of 33-42 show that the contact openings 104 are made for electrical contacts between the conductor-pattern layers and in the previous examples for contacts between a conductor-pattern layer and the components. The previously examples could, however, quite as well be modified, in such a way that with their aid contacts are made between the conductor-pattern layers, while correspondingly the examples of FIGS. 33-42 can be modified in such a way that the contacts are formed between a conductor-pattern layer and a component.

Figure 39:
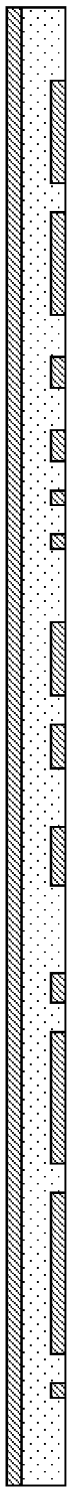

Next, an insulating layer 110 and a conductor layer 107 on top of it can be made on top of the conductor patterns 103. This can be done, for example, by laminating the layers onto the surface of the circuit-board blank, as shown in FIG. 38. The manufacture and alternative ways of manufacture are described in greater detail above in connection with FIGS. 9 and 10. After the manufacture of the insulating layer 110, the support layer 101 can be removed in the manner described in connection with FIG. 11. FIG. 39 shows a cross-section of the circuit-board blank after this intermediate stage.

Figure 40:
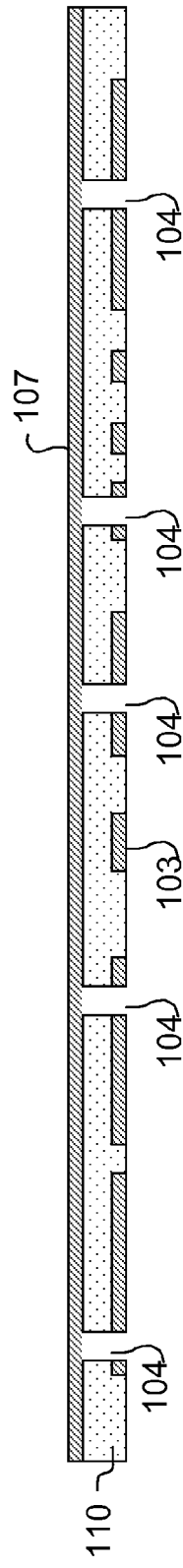

Next, vias are made in the circuit-board blank, with the aid of which electrical contacts can be created between the conductor patterns 103 and the conductor layer 107. For the manufacture of the vias, the insulating material 110 is removed from the locations of the contact openings 104. Cleaning can be performed, for example, using a plasma technique, chemically, or with the aid of a laser. FIG. 40 shows the circuit-board blank after the via holes have been opened at the locations of the contact openings 104.

After this, conductive material is introduced to the contact openings 104 and the vias, in such a way that an electrical contact is formed between the conductor patterns 103 and the conductor layer 107. The conductive material can be made, for example, by filling the contact openings with an electrically conductive paste. The conductive material can also be made using one of the many growing methods known in the circuit-board industry. High-quality electrical contacts can be made, for example, by forming a metallurgical connection by growing the conductive material by a chemical or electrochemical method. One good alternative is the growing of a thin layer using a chemical method and continuing the growing using cheaper electrochemical method. In addition to these methods, it is, of course, possible to use some other method that is advantageous in terms of the end result.

Figure 41:
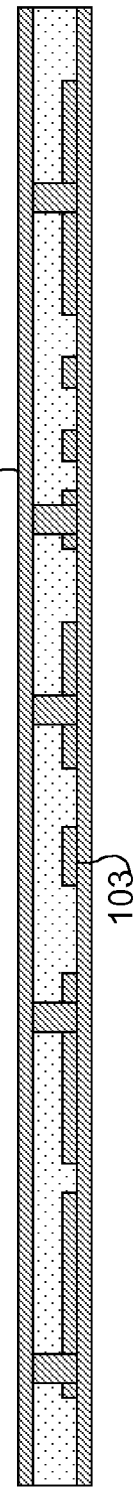

In the example of the series of figures, the bare surface remaining between the contact openings 104, the via holes, the conductor patterns 103, and the conductor patterns 103 of the insulating layer 110 is first of all surfaced with a thin conductor layer and then the thickness of the conductor layer is increased electrolytically until the contact openings 104 and the via holes are filled with conductive material. FIG. 41 shows the structure after the growing. The vias can, of course, also be manufactured in such a way that the contact openings 104 are only partly filled with conductive material. One possibility is to grow conductive material on the side walls of the contact openings 104 and leave the central part of the contact openings 104 at least mainly free of conductive material.

Figure 42:
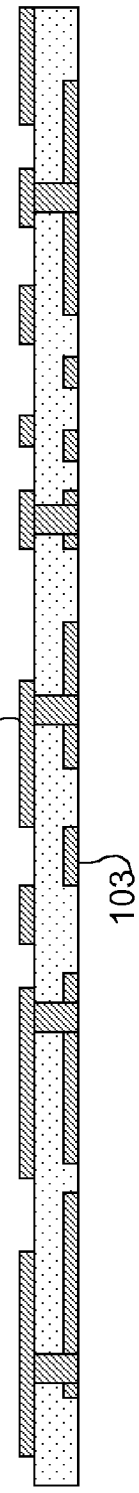

After this, the circuit-board blank is etched to remove excess conductive material. In addition, the conductor layer 107 is patterned to form a conductor pattern 117, using some suitable patterning method. The patterning of the conductor layer 107 can be made prior to the thinning etching, simultaneously with it, or after the thinning etching. FIG. 42 shows the circuit-board structure after these process stages. The finished circuit-board structure thus comprises conductor patterns 103 and 117 on both surfaces of the insulating layer 110, which are connected electrically to each other with the aid of vias.

In one variation of the method according to the fourth example shown by FIGS. 33-42, a conductor layer 107 is attached to the surface of the circuit-board blank (see FIG. 38), on the surface of which conductor patterns have already been made. If the conductor patterns are made on the surface that is pressed against the insulating layer 110, the conductor pattern is brought close to the conductor pattern 103, in which case the vias can be made shorter. In such an embodiment, it is also possible to replace the conductor layer 107 with an insulating layer. In one embodiment, the conductor layer 107 is replaced with a structure corresponding to the structure formed by the support layer 101 and the conductor pattern 103 (compare FIG. 37). The structures can then, for example, be laminated against each other, in such a way that the conductor patterns 103 lie against the insulating layer 110. The conductor layer 107 or the insulating layer replacing it can even been entirely omitted, if the conductor pattern to be attached to the circuit-board blank is itself sufficient sturdy.

The methods according to the fourth example shown by FIGS. 33-42 described above can also be modified in such a way that contact openings 104 are made to be through holes, which extend through the entire circuit-board blank. In the example of FIG. 40 this means that the contact openings 104 also penetrate the conductor layer 107. Such an embodiment is well suited for use in connection with a surfacing method.

The methods according to the example shown in FIGS. 33-42 can also be modified in such a way that a component, for example, a thin microcircuit, is placed inside the insulating layer 110. The component can be attached to the surface of the conductor pattern 103, for example, by the flip-chip method. It is also possible to proceed as in the examples described above and manufacture contact openings in the conductor pattern 103 at the locations of the contact areas of the component and manufacture conductive material in the openings, in a manner to that described in FIG. 41. It will then be possible to manufacture, using the same process and even at the same time, both contacts between the conductor patterns 103 and 117 and contacts between the conductor pattern 103 and the component located inside the insulating layer 110.

The previous examples, in which the component is located inside the insulating layer, can also be similarly modified. In these examples, it is possible to make vias through the insulating layer surrounding the insulating layer using a method corresponding to that by which contact is made to the component.

The methods according to the examples described above have numerous variations while the methods depicted by the examples can also be combined with each other. The variations can relate to individual process stages, or to the mutual sequence of the process stages.

Many features, which are not apparent from the previous examples, can also be made in the circuit-board structure. In addition to the vias participating in the creation of electrical contacts, it is possible, for example, to manufacture thermal vias, which are intended to make more efficient the conducting of heat away from the components 6, 16, or 26. The increase in the thermal conductivity is based on the fact that the thermal conductivity of a thermal via is greater than that on the surrounding insulating material. Because electrical conductors are typically also good thermal conductors, the thermal vias can usually be made using the same technique and even in the same process stage as the electrical contacts to the components 6, 16, and 26.

An electrical contact and a thermal contact (thermal via) usually differ in that the thermal contact does not form an electrical contact with the component 6, 16, or 26. For example, the thermal contact can come into contact with the component at a point at which the surface of the component is protected by an insulating protector layer. A gap, which can be, for example, 1-15 micrometres, can also be left between the surface of the thermal contact and that of the component. Thermal conductivity can be further improved by manufacturing thermal bumps on the surface of the component, which are intended to conduct heat away from the component. In that case, the thermal bumps of the component and the thermal vias of the circuit-board structure can, in the finished structure, come into mechanical contact with each other, so that the thermal contact and electrical contact will correspond very closely to each other in terms of mechanical and manufacturing-technique properties.

Generally, the number, cross-sectional area, and locations of the thermal vias or thermal contacts are selected according to the thermal transmission requirement and by taking account of the fact that the thermal conductors will not cause unreasonable interference with the electrical operation of the component. However, it is preferable to locate the thermal vias at the position of the component, or immediately adjacent to it.

In some embodiments, the thermal contacts can also be used to form electrical contacts with the component. Particularly the ground contact of the component can be naturally applied to this purpose. In that case, the ground contact of the component is made to have a considerably greater cross-sectional area than normal, or the ground contact is made from several separate ground contacts, the combined cross-sectional area of which is considerably greater than that of a conventional ground contact.

On the basis of the above, it is obvious that, with the aid of the methods described above, it is possible to make electrical contacts to both of the main surfaces of the component, i.e. to the primary contact surface and to the rear surface opposite to it.

It is also preferable to make in the circuit-board structure conductor patterns for conducting heat, corresponding to the electrical conductor patterns. Thermal contacts are made on the surface of such thermal conductors, so that the thermal contacts conduct thermal energy from the component to the thermal conductors, which conduct thermal energy in the lateral direction of the circuit-board structure away from the vicinity of the component. These lateral thermal conductors can further be combined with vertical thermal conductors, with the aid of which the thermal effect can be conducted from the innermost layers to the outer surface of the electronic module or other circuit-board structure. The thermal conductors extending to the surface can, in turn, be connected to a suitable heat sink, in which case the cooling of the component will be made even more efficient.

When using a manufacturing method, in which the contact openings 4, 14, 29, 104 are aligned and made after the manufacture of the conductor pattern, the sensitivity of the method to alignment errors can be reduced by dimensioning the diameter of the contact openings 4, 14, 29, 104 to be greater than the width of the conductors of the conductor pattern. This interesting embodiment is described in greater detail in the following, with the aid of FIGS. 43-49.

Figure 43:
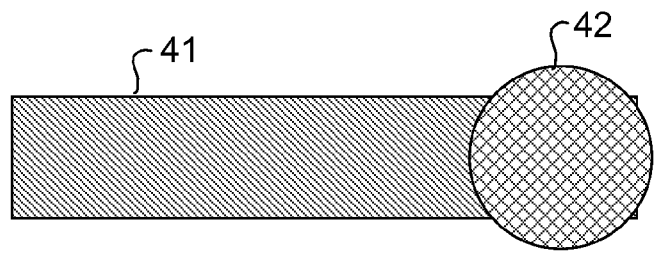
FIGS. 43-49 show in greater detail the dimensioning and alignment of vias in some embodiments.

FIG. 43 shows the end of a conductor 41 belonging to the conductor pattern and a via 42, from above (or below), i.e. at right angles to the surface of the circuit board. In the case shown in FIG. 43, the alignment of the via 42 has succeeded well at the end of the conductor 41. In this case of the first, second, and third examples described above, this means that the corresponding contact opening 4, 14, 29, 104 has been aligned correctly relative to the conductor pattern 3, 13, 25, 103. In this case, the diameter of the contact opening (and correspondingly of the via) is of no importance in terms of the success of the alignment and contact.

Figure 44:
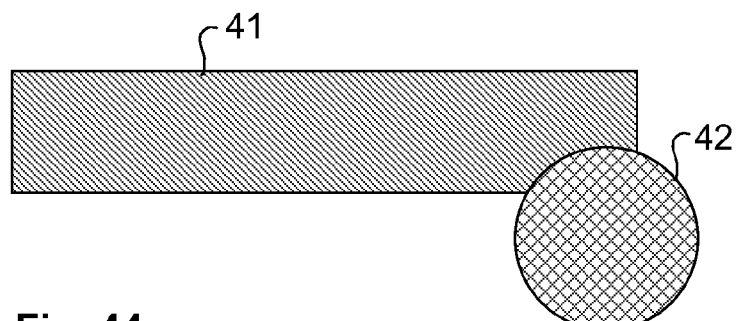
Figure 45:
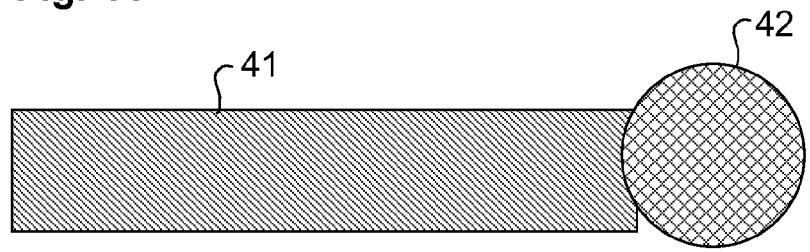
Figure 46:
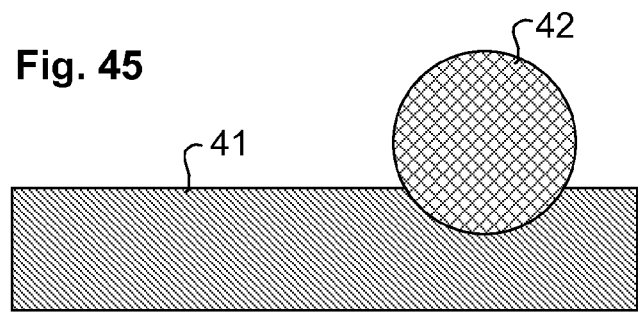

FIGS. 44-46 show, in turn, various alignment errors, in which the location of the contact opening has moved relative to the target state shown in FIG. 43. On the basis of the figures it will be noticed that, however, in each case a good electrical contact will arise between the via 42 and the conductor 41. A good contact is created particularly in an embodiment, in which the via is filled by growing metal with the aid of a chemical and/or electrochemical method. There will then be a metallurgical connection between the via 42 and the conductor 41. On the basis of FIGS. 44-46, it is obvious that such a via manufacturing method is not sensitive to alignment errors. With the aid of such a method, one or more conductor-pattern layers, which contain narrow and densely located conductors 41, can be made in a multi-layer circuit board, even in connection 2'5 with conventional circuit-board processes.

Figure 47:
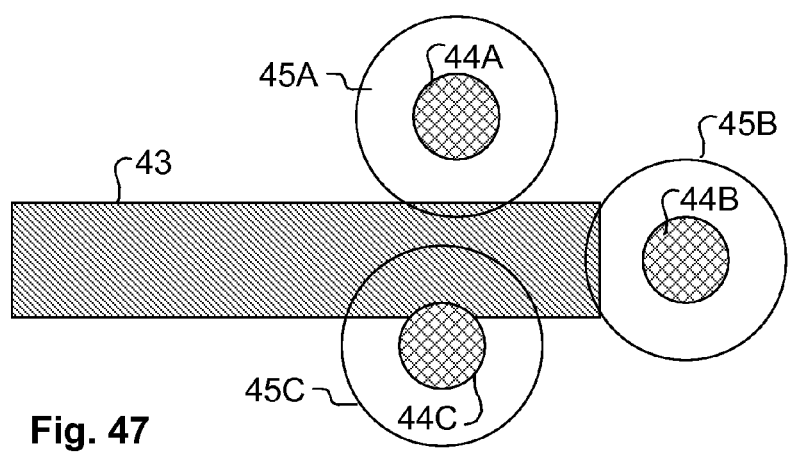
Figure 48:
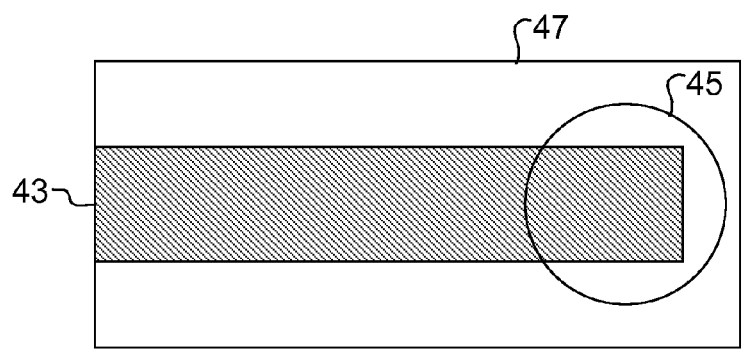
Figure 49:
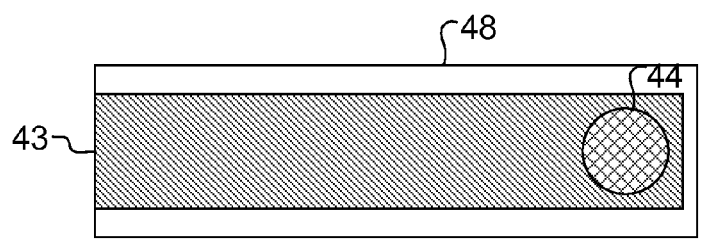

The effect of the diameter of the contact opening 4, 14, 29, 104 on the alignment tolerance is shown in greater detail in FIGS. 47-49. FIG. 47 shows a conductor 43, next to the end of which a via has been made. The via is shown in three different positions (A, B, and C), and with two different diameters (44, 45). Via 44 has a smaller diameter than via 45. In each position A, B, and C, the centre points of both vias 44 and 45 are located at the same point relative to the conductor 43. It will be observed from the example of the figure that each of the vias 45A, 45B, and 45C with the larger diameter form an electrical contact with the conductor 43. Of the vias with the smaller diameter, on the other hand, only 44C is able to form an electrical contact with conductor 43. Thus, a larger diameter in the contact opening 4, 14, 29, 104 will considerably reduce the sensitivity of the contact opening 4, 14, 29, 104 to an alignment error. FIG. 48 shows the alignment-tolerance area 47 around the conductor 43, inside which the centre point of the via 45 will ensure a good electrical contact. The alignment-tolerance area 48 of the via 44 is, in turn, shown in FIG. 49. On the basis of FIGS. 47-49, it will be observed that an enlargement of the diameter of the via will substantially reduce the sensitivity of the manufacturing process to an alignment error of the via. At the same time, the width of the conductor 43 can be kept small. The diameter of the contact openings 4, 14, 29, 104 can be, for example, at least 0.8-times, preferably at least 1-times, preferably at least 1.2 or at least 1.5-times the width of the corresponding conductor of the conductor pattern 3, 13, 25, 103.

On the basis of the above examples, it is obvious that the method can also be used in the manufacture of many different kinds of three-dimensional circuit structures. The method can be used, for example, in such a way that several semiconductor chips are place on top of each other, thus creating a packet containing several semiconductor chips, in which the semiconductor chips are connected to each other to form a functional totality. Such a packet can be referred to as a three-dimensional-multichip module. In such a module, the semiconductor chips can be selected freely and the contacts between the different semiconductor chips can be easily made according to the selected semiconductor chips.

The examples of the figures depict some possible processes, with the aid of which our invention can be exploited. However, our invention is not restricted to only the processes described above, but instead the invention covers various other processes too and their end products, within the full scope of the Claims and taking equivalence interpretation into account. The invention is also not restricted to only the structures and methods described by the examples, but instead it will be obvious to one versed in the art that various applications of our invention can be used to manufacture very many different kinds of electronic modules and circuit boards, which may even differ greatly from the examples presented. Thus the components and circuits of the figures are presented only with the intention of illustrating the manufacturing process. Many alterations can be made to the processes of the examples described above, while nevertheless not deviating from the basic idea according to the invention. The alterations can relate, for example, to the manufacturing techniques depicted in the various stages, or to the mutual sequence of the process stages.

With the aid of the method, it is also possible to manufacture component packets for attachment to a circuit board. Such packets can also contain several components, which are connected electrically to each other.

The method can also be used to manufacture entire electrical modules. The module can also be a circuit board, to the outer surface of which components can be attached, in the same way as to a conventional circuit board. The module can comprise several layers while one or more of these layers can comprise semiconductor components located inside the layer.

The invention claimed is:

1. Method for manufacturing a circuit-board structure containing at least one component (6; 16; 26), the method comprising making a conductor pattern (3; 13; 25), making contact openings (4; 14; 29) in the conductor pattern (3; 13; 25), for the electrical contacts of the component (6; 16; 26), attaching the component (6; 16; 26) relative to the conductor pattern (3; 13; 25), and introducing electrically conductive material to the contact openings (4; 14; 29), in order to create electrical contacts between the conductor pattern (3; 13; 25) and the component (6; 16; 26), wherein the conductor pattern (3) is finished before an insulating-material layer is made.

2. Method according to claim 1, in which contact openings for making vias are made in the conductor pattern (3; 13; 25), insulating-material layer, which surrounds the component (6; 16; 26), is made on the surface of the conductor pattern (3; 13; 25), a conductor layer or conductor-pattern layer is made on the surface of the insulating-material layer, through-holes for vias are made in the insulating-material layer at the locations of the contact openings that have been made, and an electrically conductive material is introduced to the through-holes, in order to create electrical contacts between the conductor pattern (3; 13; 25) and the conductor layer or conductor-pattern layer on the opposite surface of the insulating-material layer.

3. Method according to claim 2, in which electrically conductive material is introduced to the through-holes using a surfacing method.

4. Method according to claim 1, in which, after the component (6; 16) has been attached, it is surrounded with insulating material.

5. Method according to claim 1, in which a conductor pattern (25) is made on the surface of an insulating-material sheet (21), a recess (28) is made in the insulating-material sheet (21) for the component (26), and the component is attached to the recess (28) that has been made.

6. Method according to claim 1, in which the component (6; 16; 26) is attached relative to the conductor pattern (3; 13; 25; 103) by gluing.

7. Method according to claim 1, in which the component (6; 16; 26) is an unpackaged microcircuit.

8. Method according to claim 1, in which, in addition to electrical contacts, at least one thermal contact is made in the circuit-board structure, allowing for the conducting of thermal energy away from the component (6; 16; 26).

9. Method according to claim 8, in which the thermal contact is made using the same process as an electrical contact.

10. Method according of claim 1, in which the conductor pattern (3; 13; 25; 103) is finished before the component (6; 16; 26) is attached to the circuit-board structure.

11. Method according to claim 1, in which the electrically conductive material is introduced to the contact openings (4; 14; 29) using a surfacing method.

12. Method according to claim 1, in which the contact areas of the component lie opposite to the contact openings (4; 14; 29).

13. Method according to claim 1, in which the contact openings (4; 14; 29) are made before the component (6) is attached.

14. Method according to claim 1, in which the component (6) is attached before the contact openings (4; 14; 29) are made.

15. Method according to claim 1, in which several conductor layers are made in the circuit-board structure.

16. Method according to claim 1, in which several conductor layers are made in the circuit-board structure.

17. Method according to claim 1, in which the contact openings (4; 14; 29; 104) are after the conductor pattern (3; 13; 25; 103) is made.

18. Method according to claim 1, in which the contact openings (4; 14; 29; 104) are made in the conductor pattern (3; 13; 25; 103) simultaneously with the making of the conductor pattern (3; 13; 25; 103).

19. Method according to claim 1, in which at least one contact opening (4; 14; 25; 104) is aligned with a conductor of the conductor pattern (3; 13; 25; 103) and made in such a way that the diameter of the contact opening is essentially as large as the width of the conductor, or the diameter of the contact opening is at least 1.2-times.

20. Method according to claim 1, in which at least one contact opening (4; 14; 29; 104) is located partly outside of the conductors defined by the conductor pattern (3; 13; 25; 103).

21. Method according to claim 1, in which the circuit-board structure being made is an electronic module, which comprises at least two components, as well as conductor structures for connecting them to form a functional totality.

\* \* \* \* \*